(12) United States Patent
Lee et al.

(10) Patent No.: US 11,101,189 B2
(45) Date of Patent: Aug. 24, 2021

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventors: Ming Yen Lee, Kaohsiung (TW); Chia-Hao Sung, Kaohsiung (TW); Ching-Han Huang, Kaohsiung (TW); Yu-Hsuan Tsai, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/885,150

(22) Filed: May 27, 2020

(65) Prior Publication Data
US 2020/0283288 A1 Sep. 10, 2020

Related U.S. Application Data

(63) Continuation of application No. 15/921,265, filed on Mar. 14, 2018, now Pat. No. 10,689,248.
(Continued)

(51) Int. Cl.
*H01L 21/31* (2006.01)
*H01L 23/31* (2006.01)
(Continued)

(52) U.S. Cl.
CPC .............. *H01L 23/31* (2013.01); *B81B 3/007* (2013.01); *B81B 7/0061* (2013.01); *B81C 1/00658* (2013.01); *B81C 3/001* (2013.01); *H01L 22/22* (2013.01); *H01L 23/12* (2013.01); *H01L 23/13* (2013.01); *H01L 23/28* (2013.01);
(Continued)

(58) Field of Classification Search
CPC ............... B81B 7/0032; B81B 7/0061; B81C 1/00261; B81C 1/00269; B81C 1/00309; B81C 1/00333; H01L 23/04; H01L 23/10; H01L 23/13; H01L 23/28; H01L 23/3157
See application file for complete search history.

(56) References Cited

U.S. PATENT DOCUMENTS

| 4,859,808 | A | * | 8/1989 | Jeter | ................. H01L 23/49572 |
| | | | | | 174/261 |
| 6,184,062 | B1 | * | 2/2001 | Brofman | ................. H01L 24/13 |
| | | | | | 438/106 |

(Continued)

OTHER PUBLICATIONS

Non-Final Office Action for U.S. Appl. No. 15/921,265, dated Jul. 31, 2019, 16 pages.
(Continued)

*Primary Examiner* — Eduardo A Rodela
(74) *Attorney, Agent, or Firm* — Foley & Lardner LLP

(57) ABSTRACT

The present disclosure relates to a semiconductor device package. The semiconductor device package includes a substrate, a support structure, an electronic component and an adhesive. The support structure is disposed on the substrate. The electronic component is disposed on the support structure. The adhesive is disposed between the substrate and the electronic component and covers the support structure. A hardness of the support structure is less than a hardness of the electronic component.

18 Claims, 13 Drawing Sheets

Related U.S. Application Data

(60) Provisional application No. 62/472,431, filed on Mar. 16, 2017.

(51) Int. Cl.
| | | |
|---|---|---|
| B81B 3/00 | (2006.01) | |
| B81C 1/00 | (2006.01) | |
| H01L 23/538 | (2006.01) | |
| H01L 23/48 | (2006.01) | |
| H01L 23/522 | (2006.01) | |
| H01L 23/52 | (2006.01) | |
| H01L 23/525 | (2006.01) | |
| H01L 21/66 | (2006.01) | |
| B81C 3/00 | (2006.01) | |
| H01L 23/13 | (2006.01) | |
| H01L 23/12 | (2006.01) | |
| H01L 23/28 | (2006.01) | |
| B81B 7/00 | (2006.01) | |

(52) U.S. Cl.
CPC ........ *H01L 23/3157* (2013.01); *H01L 23/481* (2013.01); *H01L 23/52* (2013.01); *H01L 23/525* (2013.01); *H01L 23/5226* (2013.01); *H01L 23/5382* (2013.01); *H01L 23/5386* (2013.01); *B81B 2203/0127* (2013.01); *B81B 2207/07* (2013.01); *B81C 2201/0156* (2013.01); *B81C 2203/032* (2013.01)

(56) References Cited

U.S. PATENT DOCUMENTS

| | | | | |
|---|---|---|---|---|
| 6,351,390 | B1 * | 2/2002 | Mayer | ................. G01L 19/0069 361/760 |
| 7,239,023 | B2 * | 7/2007 | Yu-Tung | ............. H01L 23/3121 257/668 |
| 7,307,775 | B2 * | 12/2007 | Patel | ..................... B81B 7/0077 359/290 |
| 8,030,134 | B2 | 10/2011 | Kwon et al. | |
| 8,525,333 | B2 | 9/2013 | Kanetaka | |
| 9,196,602 | B2 | 11/2015 | Ren et al. | |
| 2005/0090028 | A1 * | 4/2005 | Stoute | ................. H05K 3/0079 438/29 |
| 2005/0099402 | A1 | 5/2005 | Nakanishi et al. | |
| 2013/0119492 | A1 * | 5/2013 | Feiertag | ............. B81C 1/00238 257/416 |
| 2013/0149805 | A1 | 6/2013 | Chuang et al. | |
| 2014/0027920 | A1 | 1/2014 | Kodama | |
| 2015/0014398 | A1 * | 1/2015 | Okamoto | ............... H05K 3/303 228/176 |
| 2015/0226585 | A1 | 8/2015 | Yang | |
| 2016/0209681 | A1 | 7/2016 | Hung et al. | |
| 2016/0297671 | A1 | 10/2016 | Pahl | |
| 2017/0006368 | A1 * | 1/2017 | Brioschi | ................ H04R 19/04 |
| 2017/0038209 | A1 | 2/2017 | Bowles et al. | |
| 2017/0048625 | A1 | 2/2017 | Salmon | |
| 2017/0374441 | A1 * | 12/2017 | Hoekstra | ............... H04R 1/2853 |
| 2017/0374442 | A1 | 12/2017 | Pennock et al. | |
| 2018/0136063 | A1 | 5/2018 | Wagner | |
| 2018/0148323 | A1 * | 5/2018 | Ghidoni | ................. G01J 1/429 |

OTHER PUBLICATIONS

Non-Final Office Action for U.S. Appl. No. 15/921,265, dated May 15, 2019, 13 pages.

Notice of Allowance for U.S. Appl. No. 15/921,265, dated Feb. 18, 2020, 9 pages.

\* cited by examiner

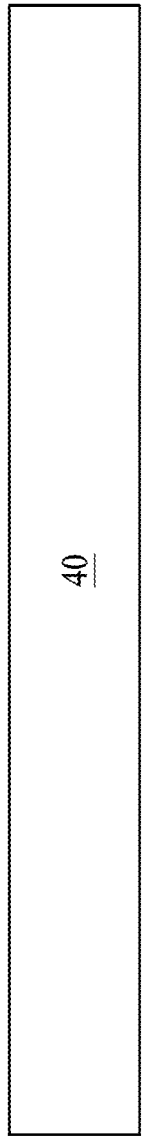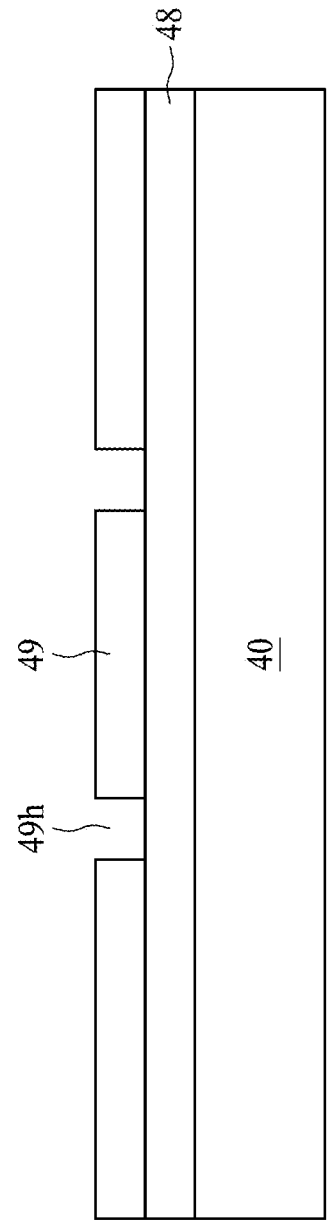

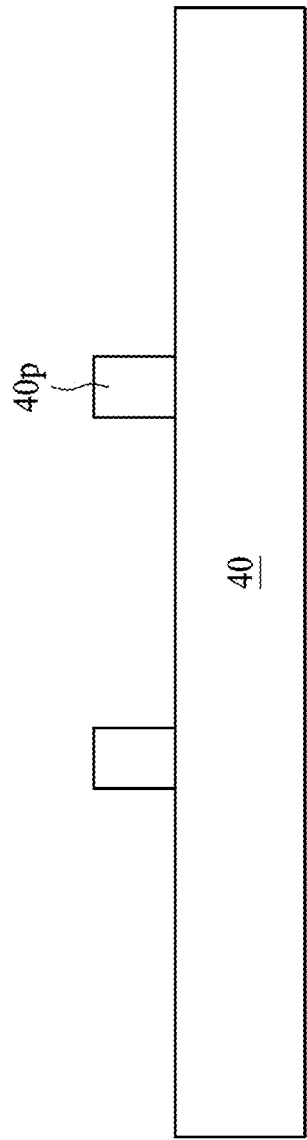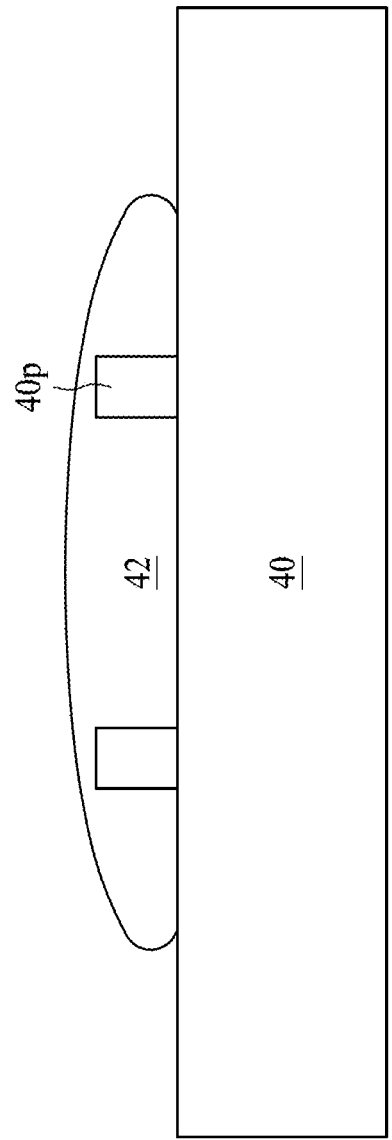

SEMICONDUCTOR DEVICE PACKAGE AND METHOD OF MANUFACTURING THE SAME

CROSS-REFERENCE TO RELATED APPLICATION

This application is a continuation of U.S. patent application Ser. No. 15/921,265 filed Mar. 14, 2018, which claims the benefit of and priority to U.S. Provisional Application No. 62/472,431, filed Mar. 16, 2017, the contents of which are incorporated herein by reference in their entireties.

BACKGROUND

1. Technical Field

The present disclosure relates to a semiconductor device package, more particularly, to a semiconductor device package including a substrate with a support element and method of manufacturing the same.

2. Description of the Related Art

A semiconductor device package may include a semiconductor device which is attached or bonded to a carrier (a substrate, a leadframe or the like) by an adhesive material. The bond line thickness (BLT) or thickness of the adhesive material is one of the factors that may affect performance of the semiconductor device package. It is challenging to control BLT due to various manufacturing conditions (e.g. error or deviation resulted from machine(s) used to attach or bond the semiconductor device to the carrier, characteristic of the adhesive material, etc.).

Moreover, the carrier to which the semiconductor device is attached or bonded may have a hole to facilitate the semiconductor device's performance (e.g. micro-electromechanical system (MEMS) devices). However, the adhesive material may bleed or flow into the hole to adversely affect the performance of the semiconductor device package.

Further, the semiconductor device's center of gravity may not overlap with its geometric center, which may cause the semiconductor device to tilt when (or subsequent) to placing the semiconductor device to the adhesive material. Tilt of the semiconductor device may also adversely affect the performance of the semiconductor device package.

SUMMARY

In some embodiments of the present disclosure, a semiconductor device package includes a substrate, a support structure, an electronic component and an adhesive. The support structure is disposed on the substrate. The electronic component is disposed on the support structure. The adhesive is disposed between the substrate and the electronic component and covers the support structure. A hardness of the support structure is less than a hardness of the electronic component.

In some embodiments of the present disclosure, a semiconductor device package includes a substrate, a support structure, a MEMS device and an adhesive. The substrate has an opening penetrating the substrate. The support structure is disposed on the substrate. The MEMS device is disposed on the support structure. The MEMS device has a cavity corresponding to the opening of the substrate. The adhesive is disposed between the substrate and the MEMS device and covers the support structure. A hardness of the support structure is less than a hardness of the MEMS device.

In some embodiments of the present disclosure, a method of manufacturing a semiconductor device package including (a) providing a substrate; (b) placing a photosensitive layer on the substrate; (c) removing a portion of the photosensitive layer to form a support structure; (d) applying an adhesive to cover the support structure; and (e) connecting an electronic component on the support structure through the adhesive.

BRIEF DESCRIPTION OF THE DRAWINGS

FIG. 4A, FIG. 4B, FIG. 4C, FIG. 4D and FIG. 4E illustrate a method for manufacturing a semiconductor device package in accordance with some embodiments of the present disclosure;

Common reference numerals are used throughout the drawings and the detailed description to indicate the same or similar elements. The present disclosure will be readily understood from the following detailed description taken in conjunction with the accompanying drawings.

DETAILED DESCRIPTION

Figure 1A:
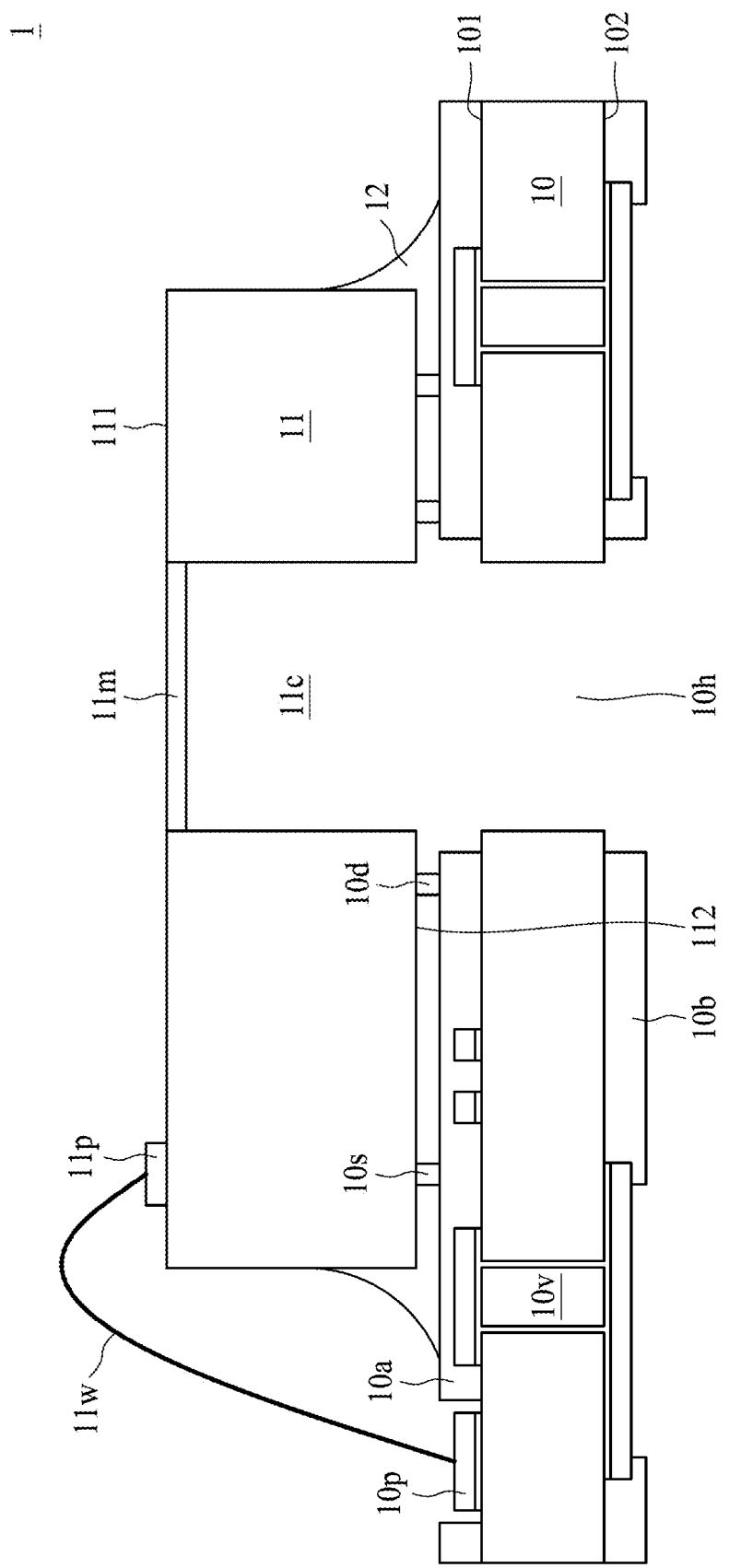
FIG. 1A illustrates a cross-sectional view of a semiconductor device package in accordance with some embodiments of the present disclosure.

FIG. 1A illustrates a semiconductor device package 1 in accordance with some embodiments of the present disclosure. The semiconductor device package 1 includes a substrate 10, a MEMS device 11 (or abbreviated as MEMS 11) and an adhesive 12.

The substrate 10 may be, for example, a printed circuit board (PCB), such as a paper-based copper foil laminate, a composite copper foil laminate, a polymer-impregnated glass-fiber-based copper foil laminate, or a combination of two or more thereof. The substrate 10 may include an interconnection structure, such as a redistribution layer (RDL) or a grounding element. The substrate 10 may include a through via 10v penetrating the substrate 10 to provide an electrical connection between a surface 101 (also referred to as a top surface or a first surface) of the substrate 10 and a surface 102 (also referred to as a bottom surface or a second surface) of the substrate. The substrate 10 defines an opening (or a gap) 10h penetrating the substrate 10. The substrate 10 may include a solder resist 10a on the surface 101 of the substrate 10. The solder resist 10a can expose the conductive pad 10p. The solder resist 10a can expose at least a portion of the conductive pad 10p. The substrate 10 may include a solder resist 10b on the surface 102 of the substrate 10. The solder resist 10b can expose the conductive pad 10p. The solder resist 10b can expose at least a portion of the conductive pad 10p.

The MEMS 11 is disposed on the substrate 10 and across the opening 10h of the substrate 10. The MEMS 11 is attached the substrate 10 through the adhesive 12 (e.g., glue). The MEMS has an active surface (also referred to as active side) 111 facing away the surface 101 of the substrate 10 and a back surface (also referred to as back side) 112 opposite to the active surface 111 (i.e., facing toward the surface 101 of the substrate 10). The MEMS 11 defines a cavity 11c that is disposed, at least in part, over the opening 10h. The MEMS 11 includes a membrane 11m that constitutes at least a portion of a top wall or ceiling of the cavity 11c. The MEMS 11 includes an electric connection 11p (e.g. a pad) on its active surface 111 and connected to a conductive pad 10p on the surface 101 of the substrate 10 through a bonding wire 11w. The MEMS 11 is configured to receive or detect at least one physical signal from environment (e.g., sound, pressure, temperature, humidity, gas, and the like) and to convert the received physical signal to an electrical signal (e.g., for subsequent processing). In some embodiments, the MEMS 11 can be, e.g., a pressure sensor, a microphone, a barometer, a thermometer, a hygrometer, a gas detector, and the like.

Support structures (e.g., a dam-like structure 10d and pillars 10s) are disposed on the surface 101 the substrate 10. The MEMS 11 is disposed on the dam-like structure 10d and pillars 10s. In some embodiments, the MEMS 11 is in contact with (and e.g. rests on, or is structurally supported by) the dam-like structure 10d and the pillars 10s. In some embodiments, the dam-like structure 10d or the pillars 10s may be implemented individually (e.g. a dam-like structure 10d may be implemented with no pillars 10s, or pillars 10s may be implemented with no dam-like structure 10d). The dam-like structure 10d is a raised structure that surrounds at least a portion of the opening 10h. In some embodiments, the dam-like structure 10d substantially completely surrounds the opening 10h. This can prevent the adhesive 12 from flowing into the opening 10h.

The dam-like structure 10d may have a substantially flat top surface on which the MEMS 11 is disposed (e.g. a top surface of the dam-like structure 10d may be substantially planar and may have a same orientation as a bottom surface of the MEMS 11 that is in contact with the top surface). This can help to provide an even surface on which to dispose the MEMS 11, and can help to ensure a desired orientation of the MEMS 11. Furthermore, disposing the MEMS 11 on the dam-like structure 10d can help to ensure that the BLT has a desired thickness (e.g., equal to or greater than 50 µm). For example, as shown in FIG. 1A, the adhesive 12 may substantially fill a volume defined by the MEMS 11, the substrate 10 and the substrate dam-like structure 10d, and the adhesive 12 may thus constitute an adhesive layer disposed under the MEMS 11 having a height substantially equal to a height of the dam-like structure 10d, and having a substantially planar top surface. In some embodiments, the adhesive 12 does not necessarily substantially fill the volume defined by the MEMS 11, the substrate 10 and dam-like structure 10d. The BLT, corresponding to a height of the adhesive layer, may be, for example, substantially in a range of about 90% to about 100% of the height of the dam-like structure 10d.

In some embodiments, a hardness of the dam-like structure 10d is less than that of the MEMS 11. For example, a hardness of the dam-like structure 10d is about 3H (e.g., which is presented by pencil hardness). In some embodiments, the dam-like structure may include polymeric materials or photosensitive materials, such as solder resist material (e.g., solder mask). The dam-like structure 10d can be of any suitable shape. For example, the dam-like structure 10d can be substantially ring shaped, the ring surrounding the opening 10h. In other embodiments, the dam-like structure 10d can have any closed shape (e.g., a square) that surrounds the opening 10h. In some embodiments, the dam-like structure 10d need not completely surround the opening 10h.

The pillars 10s are disposed on the surface 101 of the substrate 10 and are located further from the opening 10h than is the dam-like structure 10d. In other embodiments, at least one pillar 10s is located closer to the opening 10h than is the dam-like structure 10d. The pillars 10s can be of a substantially same height as the dam-like structure 10d, or may be a different height. The pillars 10s need not all be the same height. In some embodiments, the dam-like structure 10d and the pillars 10s are disposed on substantially coplanar portions of the substrate 10. In some embodiments, the dam-like structure 10d and the pillars 10s are located on portions of the substrate 10 that are not coplanar. The pillars 10s can provide structural support to the MEMS 11, and/or ensure that the MEMS 11 is disposed on a substantially even surface, and/or ensure that the BLT has a desired thickness (e.g., equal to or greater than 50 µm). In some embodiments, the pillars 10s and the dam-like structure 10d are formed of the same material. Alternatively, the pillars 10s and the dam-like structure 10d are formed of different materials.

In some embodiments, the dam-like structure 10d and/or the pillars 10s includes or formed of metal materials (e.g., metal bumps). However, because the hardness of the metal is relatively high (e.g., the pencil hardness of copper is 9H, which is equivalent to or greater than the hardness of the MEMS 11), the MEMS 11 may be damaged or crack by the metal bumps. In addition, the metal bumps should be formed by the operations of lithography, electroplating, grinding and the like to ensure each of the metal bumps having an equivalent height, which would increase the time, complexity and the cost for manufacturing the semiconductor device package. In accordance with some embodiments shown in FIG. 1A, the dam-like structure 10d and/or the pillars 10s are formed of polymeric materials or photosensitive materials (e.g., solder resist material). Because the hardness of polymeric materials or photosensitive materials is less than the hardness of the MEMS 11, it can prevent the MEMS 11 from dam-leakage or crack by the dam-like structure 10d and/or the pillars 10s. Moreover, the location, the thickness and the height of the dam-like structure 10d and/or the pillars 10s can be easily controlled or designed by the lithographic process, which would reduce the time, complexity and the cost for manufacturing the semiconductor device package 1.

Figure 1B:
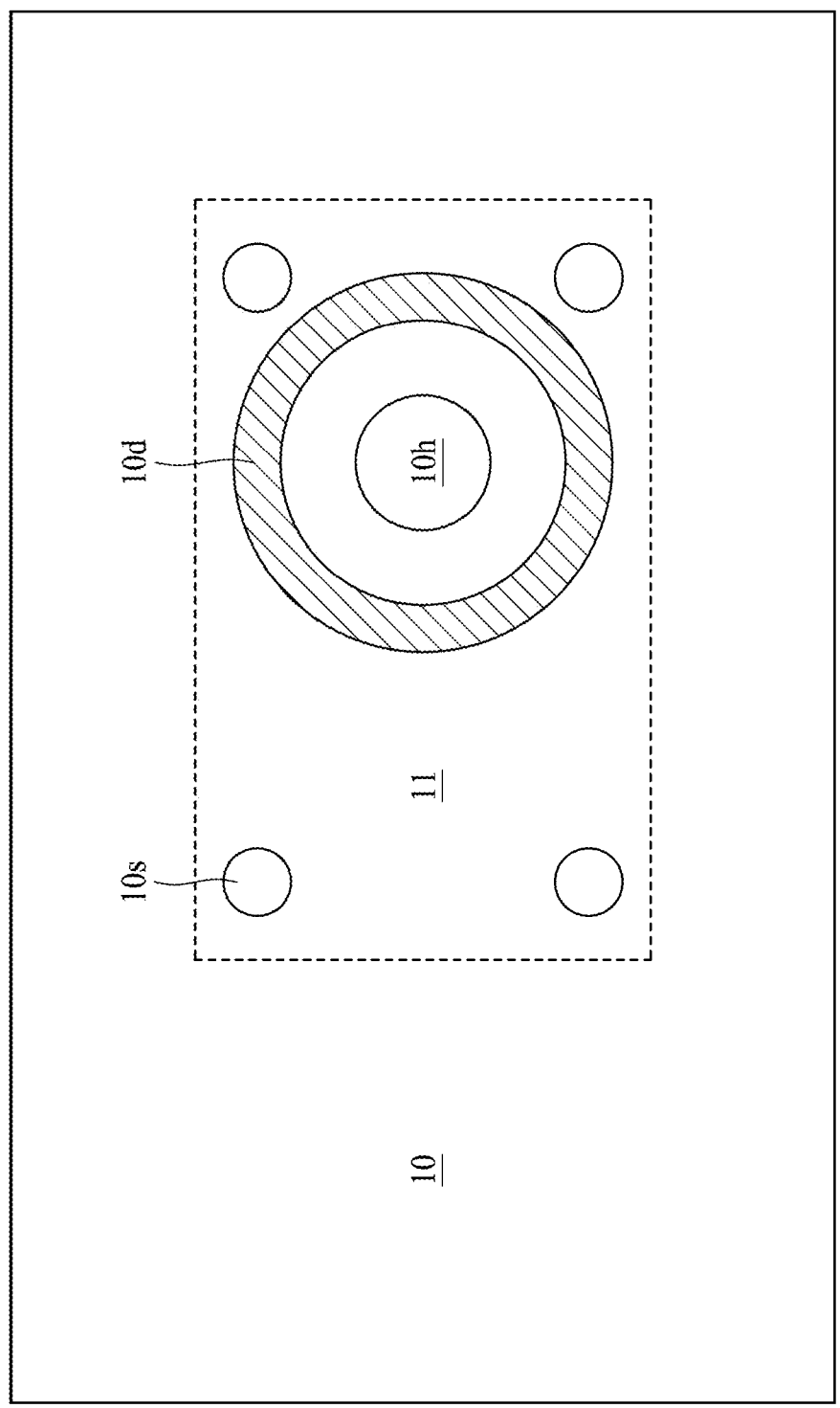
FIG. 1B illustrates a top view of the semiconductor device package in FIG. 1A in accordance with some embodiments of the present disclosure.

FIG. 1B illustrates a top view of the semiconductor device package 1 in accordance with some embodiments of the present disclosure. As shown in FIG. 1B, the dam-like structure 10d is disposed on the substrate 10 and surrounds the opening 10h. The pillars 10s are respectively located near or adjacent to each corner of the MEMS 11. The MEMS 11 is disposed on the dam-like structure 10d and the pillars 10s.

Figure 1C:
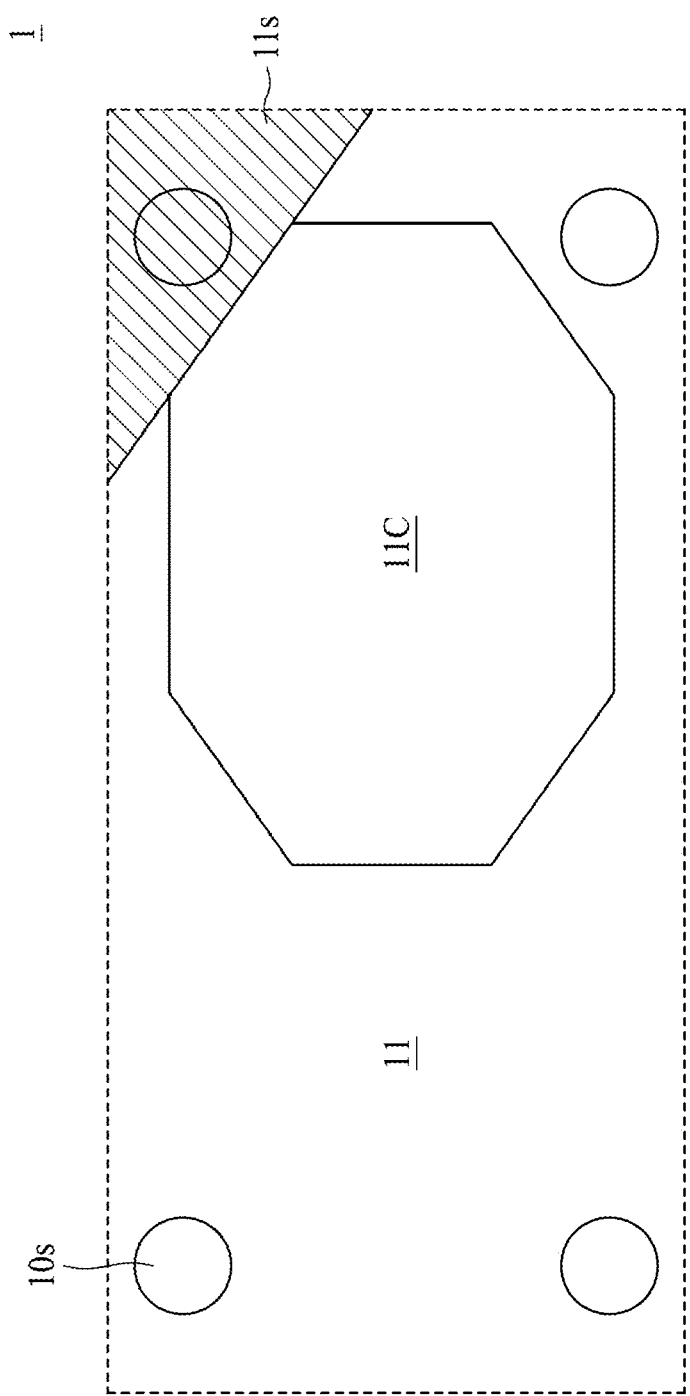
FIG. 1C illustrates the MEMS in FIG. 1A from a bottom view in accordance with some embodiments of the present disclosure.

FIG. 1C illustrate the MEMS 11 from a bottom view in accordance with some embodiments of the present disclosure. The pillars 10s are in contact with the MEMS 11 on a bottom side of the MEMS 11. The cavity 11c is open on the bottom side of the MEMS 11, and may be disposed over the opening 10h of the substrate 10. A shaded area 11s of the MEMS 11 is shown in FIG. 1C, indicating one possible die-shift tolerance for the particular configuration shown. The shaded area 11s does not extend to the left-most half of the cavity 11c, and does not extend to the bottom-most half of the cavity 11c. In other words, at least one pillar 10s is located on a horizontally opposite side of the cavity 11c as is another pillar 10s, and is located on a vertically opposite side of the cavity 11c as is yet another pillar 10s. The depicted MEMS 11 may, during the manufacture of the MEMS semiconductor package 1, be shifted relative to the pillars 10s such that the pillar 10s shown in the upper right hand corner of the MEMS 11 is in contact with the MEMS 11 in the shaded area 11s. A shift of the MEMS 11 relative to the pillars 10s that results in the pillar 10s under discussion being in contact with the MEMS 11 outside of the shaded area 11s may be undesirable in some cases. In other words, it may be preferable in some cases to dispose a pillar 10s (located closest to the upper right hand corner of the MEMS 11, out of the pillars 10s) in the shaded area 11s.

Figure 2:
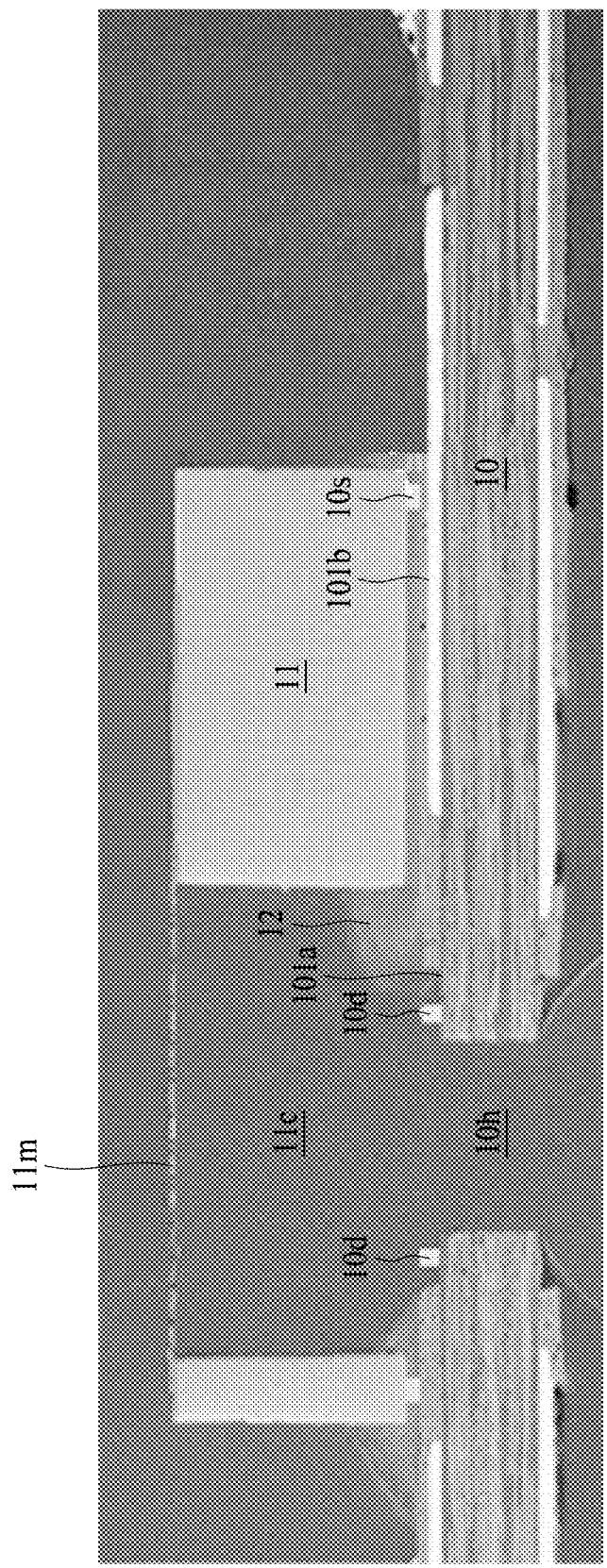
FIG. 2 shows microscope image of a semiconductor device package in accordance with some embodiments of the present disclosure.

FIG. 2 shows microscope image of the semiconductor device package 2 in accordance with some embodiments of the present disclosure. In some embodiments, the semiconductor device package 2 is the same as the semiconductor device package 1 in FIG. 1A. Alternatively, the semiconductor device package 2 is different from the semiconductor device package 1 in FIG. 1A. In FIG. 2, the MEMS 11 is disposed on the pillars 10s which are respectively located on opposite sides of the opening 10h, and the MEMS 11 is not in contact with the dam-like structure 10d. The dam-like structure 10d is located on a portion 101a of the surface of the substrate 10 that is lower than a portion 101b of the surface on which the pillars 10s are located. The pillars 10s extend higher than does the dam-like structure 10d. The dam-like structure 10d can prevent the adhesive 12 from flowing into the opening 10h. The MEMS 11 in the depicted embodiments includes two portions that are respectively located on different sides of the opening 10h. The two portions are connected by the membrane 11m, which extends across the opening 10h.

FIGS. 3A, 3B, 3C, 3D, 3E and 3F illustrate a method of manufacturing the semiconductor device package 1 as shown in FIG. 1A in accordance with some embodiments of the present disclosure. In some embodiments, the method shown in FIGS. 3A, 3B, 3C, 3D, 3E and 3F can be used to manufacture other semiconductor device packages.

Figure 3A:
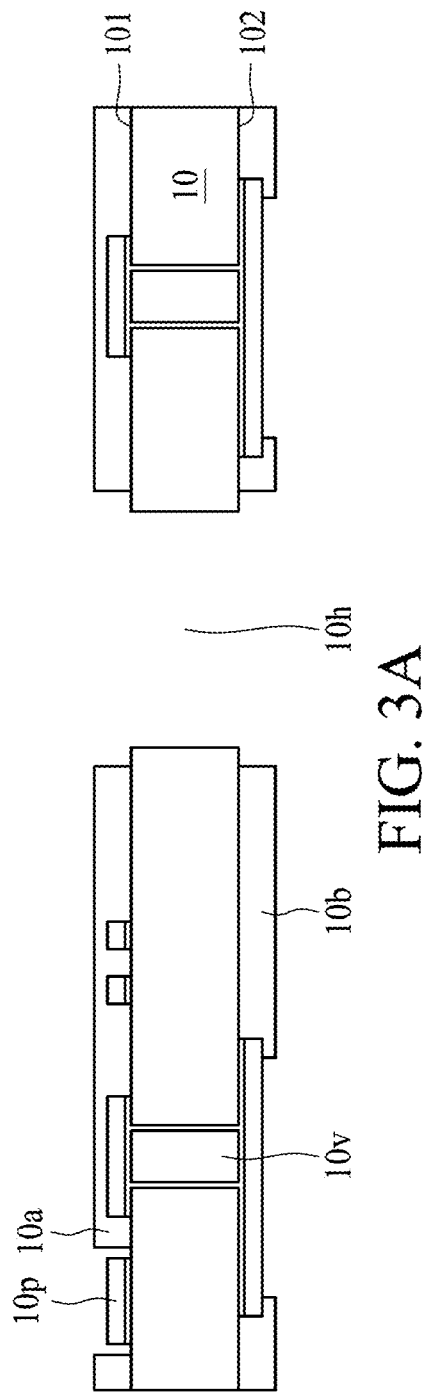
FIG. 3A, FIG. 3B, FIG. 3C, FIG. 3D, FIG. 3E and FIG. 3F illustrate a method for manufacturing a semiconductor device package in accordance with some embodiments of the present disclosure.

Referring to FIG. 3A, the substrate 10 is provided. The substrate 10 can include, for example, one or more traces, vias 10v, and pads 10p. An opening 10h is formed to penetrate the substrate 10. In some embodiments, the opening 10h may be formed by, for example, drilling, laser or etching technique.

Figure 3B:
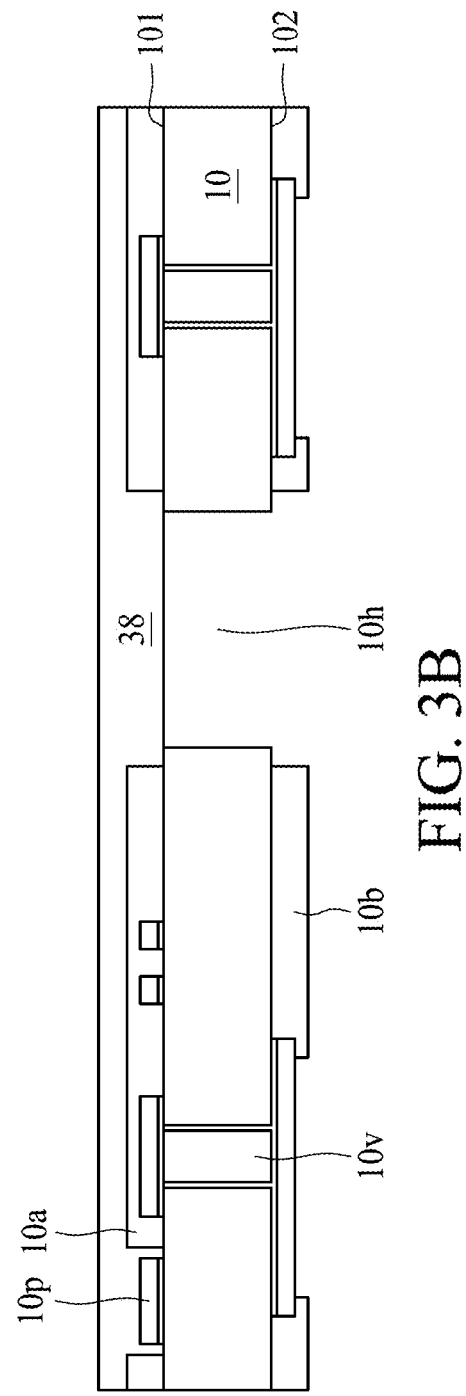

Referring to FIG. 3B, a solder mask layer 38 is placed or formed (e.g. by solder mask printing) on the surface 101 of the substrate 10. The solder mask layer 38 may cover the opening 10h of the substrate 10. In other embodiments, the solder mask layer 38 includes sub-portions disposed on opposite sides of the opening 10h of the substrate 10, and the solder mask layer 38 does not cover the opening 10h.

Figure 3C:
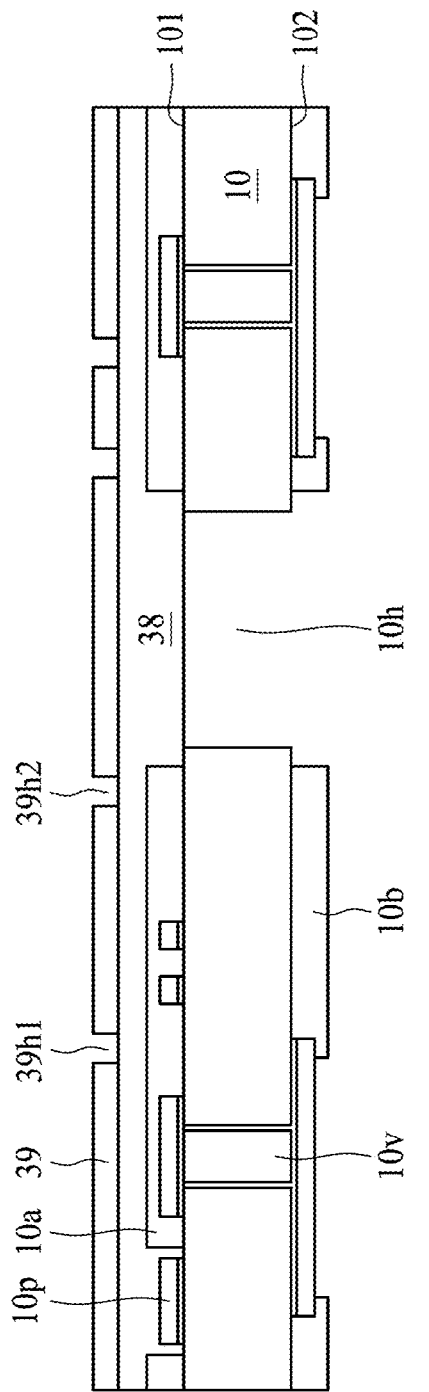

Referring to FIG. 3C, an optical mask 39 is disposed over the solder mask layer 38. The optical mask 39 defines gaps 39h1, 39h2 that expose one or more areas of the solder mask layer 38. In some embodiments, the gaps 39h1 are located further from the opening 10h than is the gap 39h2. In other embodiments, at least one gap 39h1 can be located closer to the opening 10h than is the gap 39h2. The gap 39h2 completely surrounds the opening 10h. The gap 39h2 can be of any suitable shape, e.g., a ring or a square. In other embodiments, the gap 39h2 does not completely surround the opening 10h. In some embodiments, a depth of the gaps 39h1 is substantially same as a depth of the gap 39h2. Alternatively, the depth of the gaps 39h1 can be different from the depth of the gap 39h2. The optical mask 39 is then exposed to, for example, ultraviolet (UV) radiation, thus curing the portions of the solder mask layer 38 exposed by the optical mask 39.

Figure 3D:
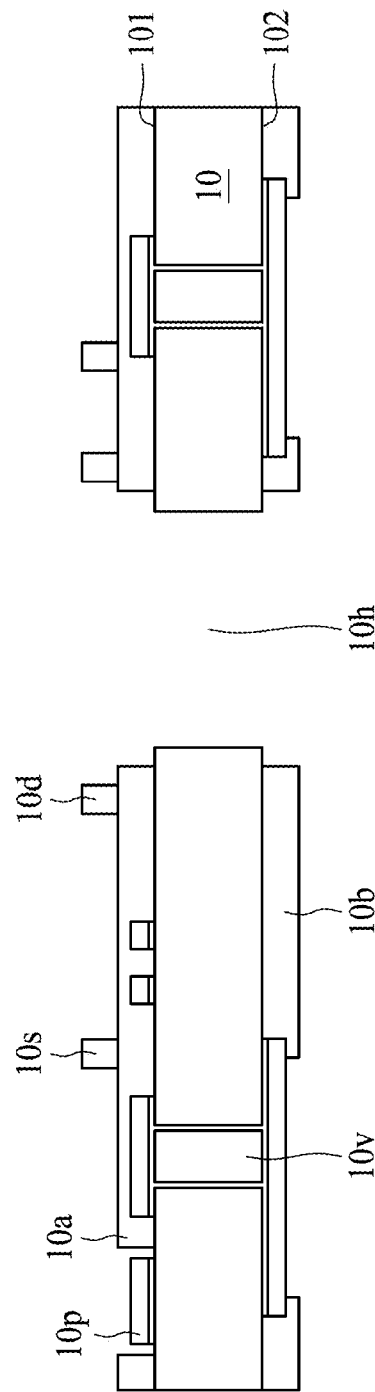

Referring to FIG. 3D, the optical mask 39 is removed, and uncured portions of the solder mask layer 38 are removed, leaving pillars 10s and the dam-like structure 10d that are constituted by cured portions of the solder mask layer 38.

Figure 3E:
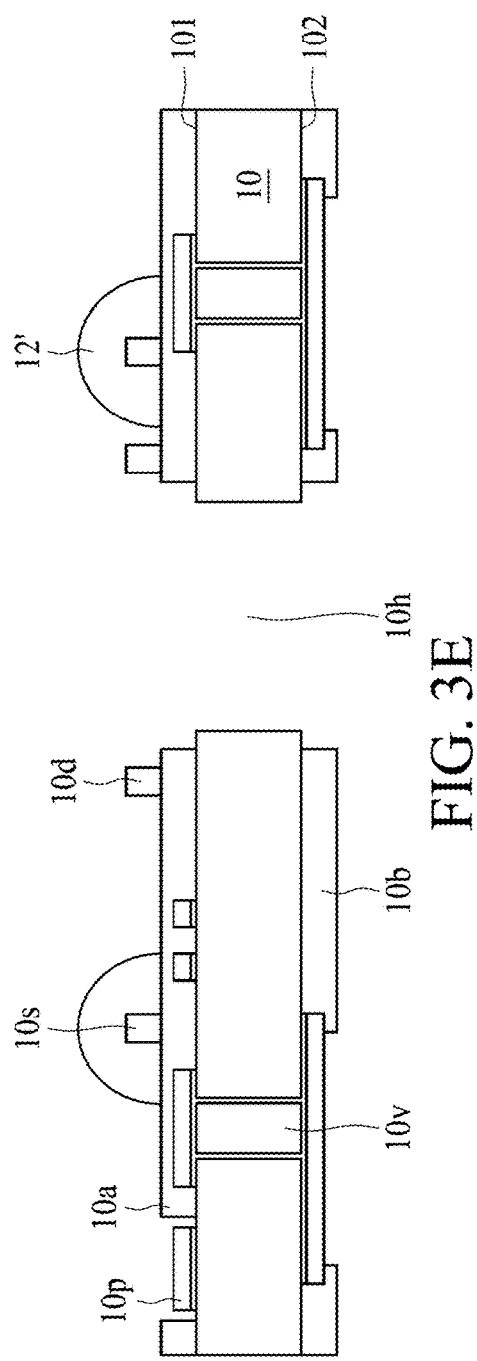

Referring to FIG. 3E, adhesive 12' is disposed on the pillars 10s, which can cover or encapsulate the pillars 10s. The adhesive 12' is not disposed on the dam-like structure 10d.

Figure 3F:
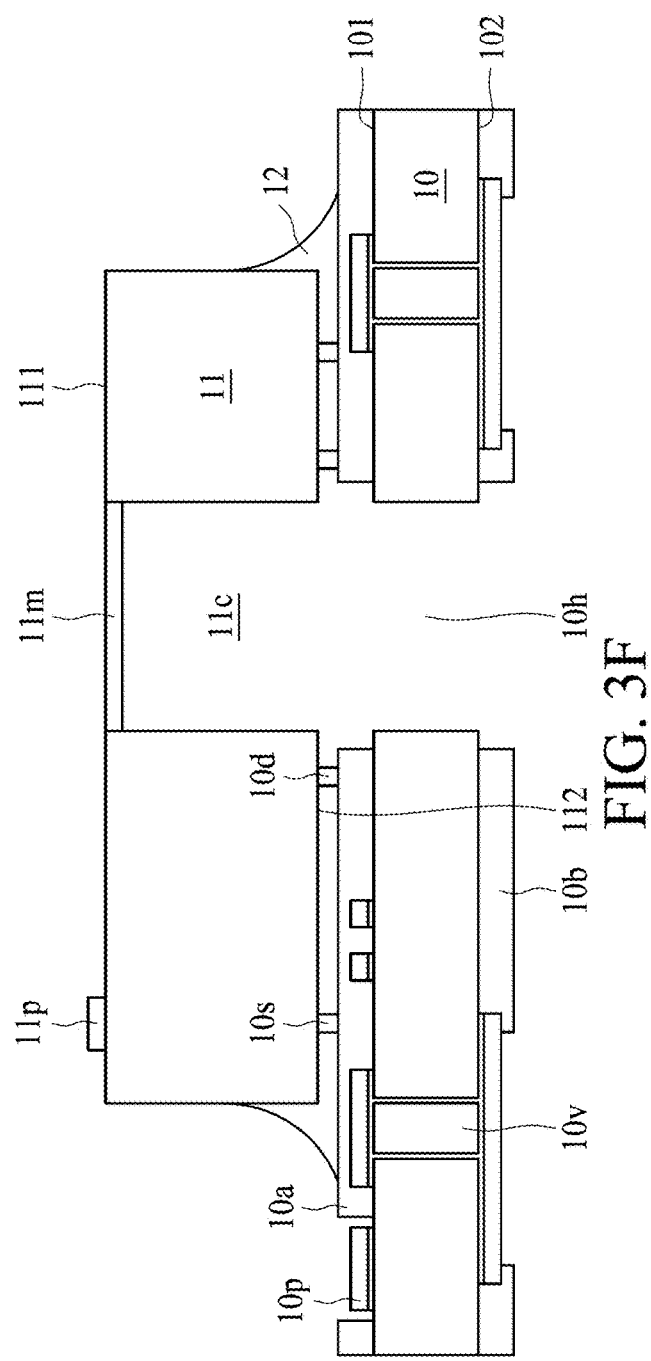

Referring to FIG. 3F, the MEMS 11 is disposed (and may be pressed down) on the pillars 10s, the dam-like structure 10d and the adhesive 12', such that the MEMS 11 and the pillars 10s or the dam-like structure 10d are in contact with each other, and the MEMS 11 is thus bonded to the surface 101 of the substrate 10. A final curing process may be implemented to cure the adhesive 12' to form the semiconductor device package 1 in FIG. 1A.

The method shown in FIGS. 3A, 3B, 3C, 3D, 3E and 3F can be used to manufacture semiconductor device packages in which a component disposed over an opening of a substrate (e.g. the MEMS 11 disposed over the opening 10h) can be bonded to the substrate via an adhesive with a desired BLT. Pillars 10s formed in this process can provide a strong and even surface on which to dispose the component. Furthermore, the dam-like structure 10d can prevent the adhesive 12 from bleeding or flowing into the opening 10h of the substrate 10. Because the hardness of pillars 10s and the dam-like structure 10d (formed of the solder mask layer 38) is less than the hardness of the MEMS 11, it can prevent the MEMS 11 from being damaged or crack by the dam-like structure 10d and/or the pillars 10s. Moreover, the location, the thickness and the height of the dam-like structure 10d and/or the pillars 10s can be easily controlled or designed by the lithographic process as shown in FIG. 3C, which would reduce the time, complexity and the cost for manufacturing the semiconductor device package.

FIGS. 4A, 4B, 4C, 4D and 4E illustrate a method of manufacturing a semiconductor device package 4 in accordance with some embodiments of the present disclosure.

Referring to FIG. 4A, the substrate 40 is provided. The substrate 40 may be, for example, a PCB, such as a paper-based copper foil laminate, a composite copper foil laminate, a polymer-impregnated glass-fiber-based copper foil laminate, or a combination of two or more thereof. The substrate 40 may include an interconnection structure, such as a RDL or a grounding element.

Referring to FIG. 4B, a solder mask layer 48 is placed or formed (e.g. by solder mask printing) on the substrate 40. An optical mask 49 is then disposed over the solder mask layer 48. The optical mask 49 defines gaps 49h that exposes one or more areas of the solder mask layer 48. The optical mask 49 is then exposed to, for example, UV radiation, thus curing the portions of the solder mask layer 48 exposed by the optical mask 49.

Referring to FIG. 4C, the optical mask 49 is removed, and uncured portions of the solder mask layer 48 are removed, leaving pillars 40p that are constituted by cured portions of the solder mask layer 48.

Referring to FIG. 4D, adhesive 42 is disposed on the pillars 40p, which can cover or encapsulate the pillars 40p.

Figure 4E:
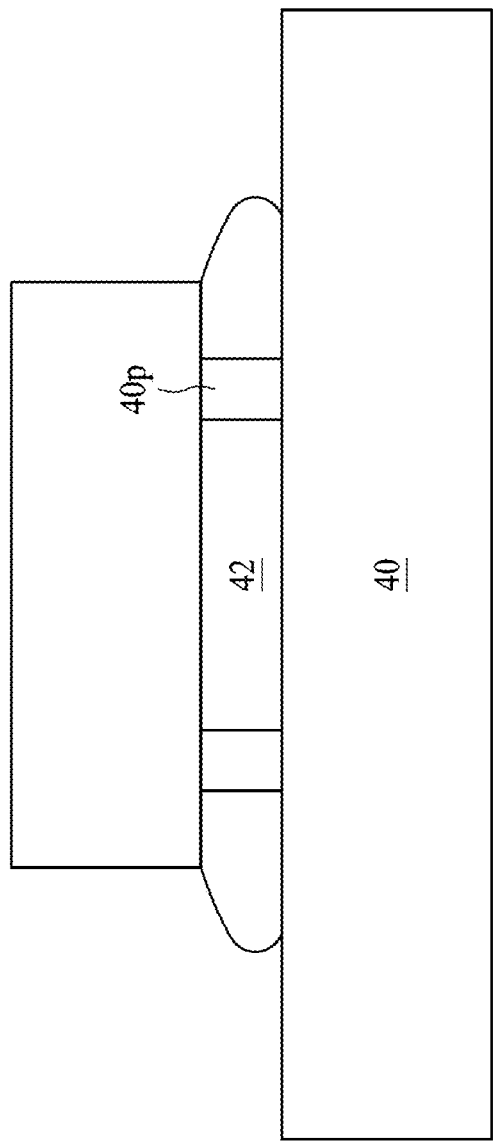

Referring to FIG. 4E, an electronic component 41 is disposed (and may be pressed down) on the pillars 40p and the adhesive 42, such that the electronic component 41 and the pillars 40p are in contact with each other, and the electronic component 41 is thus bonded to the substrate 40. A final curing process may be implemented to cure the adhesive 42 to form the semiconductor device package 4. In some embodiments, the electronic component 41 may be or include an inertial measurement unit (IMU), a pressure sensor, a long distance optical sensor, a gas sensor and/or any other components that require a stable and precise BLT control.

Figure 5A:
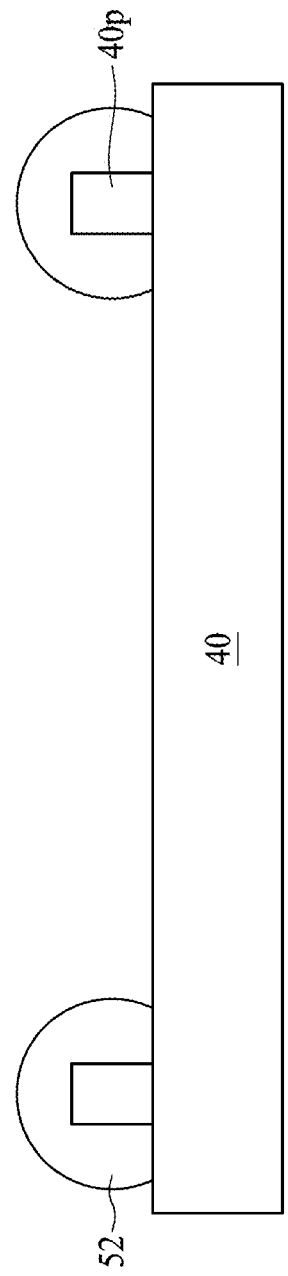
FIG. 5A, FIG. 5B, FIG. 5C and FIG. 5D illustrate a method for manufacturing a semiconductor device package in accordance with some embodiments of the present disclosure.

FIGS. 5A, 5B, 5C and 5D illustrate a method of manufacturing a semiconductor device package 5 in accordance with some embodiments of the present disclosure. In some embodiments, the operation in FIG. 5A is performed subsequent to the operation in FIG. 4C.

Referring to FIG. 5A, adhesive 52 is disposed on the pillars 40p, which can cover or encapsulate the pillars 40p. In some embodiments, the pillars 40p are formed on the substrate 40 as shown in FIG. 5D, which illustrates a perspective view of the structure in FIG. 5A in accordance with some embodiments of the present disclosure.

Figure 5B:
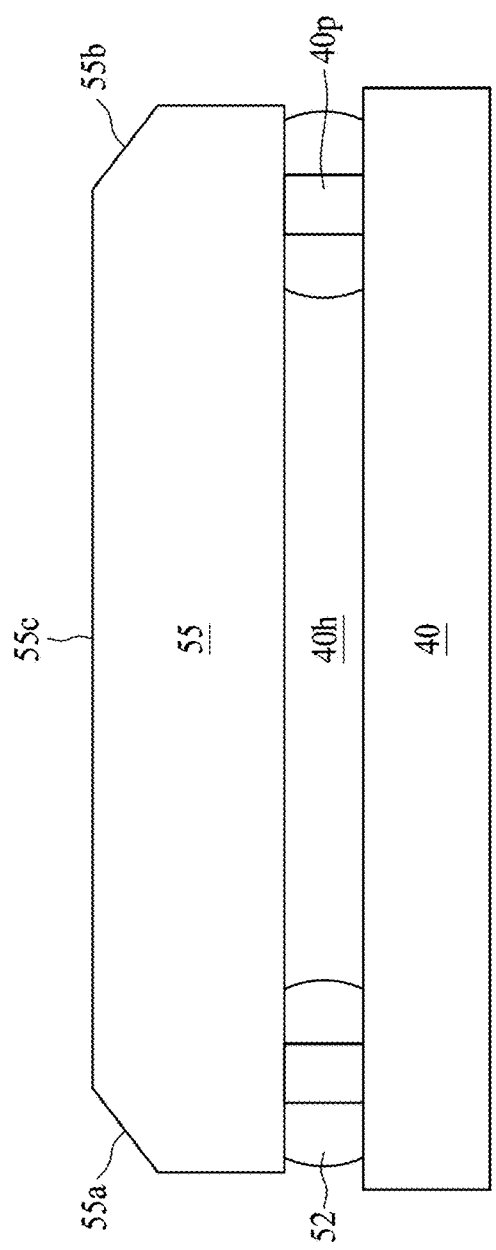

Referring to FIG. 5B, a glass layer 55 is disposed (and may be pressed down) on the pillars 40p and the adhesive 52, such that the glass layer 55 and the pillars 40p are in contact with each other, and the glass layer 55 is thus bonded to the substrate 40. A final curing process may be implemented to cure the adhesive 52. In some embodiments, the glass layer 55 includes a first surface 55a configured to receive light and the second surface 55b configured to output the light. The glass layer 55 further includes a third surface 55c coated by an opaque material to prevent the light from emitting out of the third surface 55c.

Figure 5C:
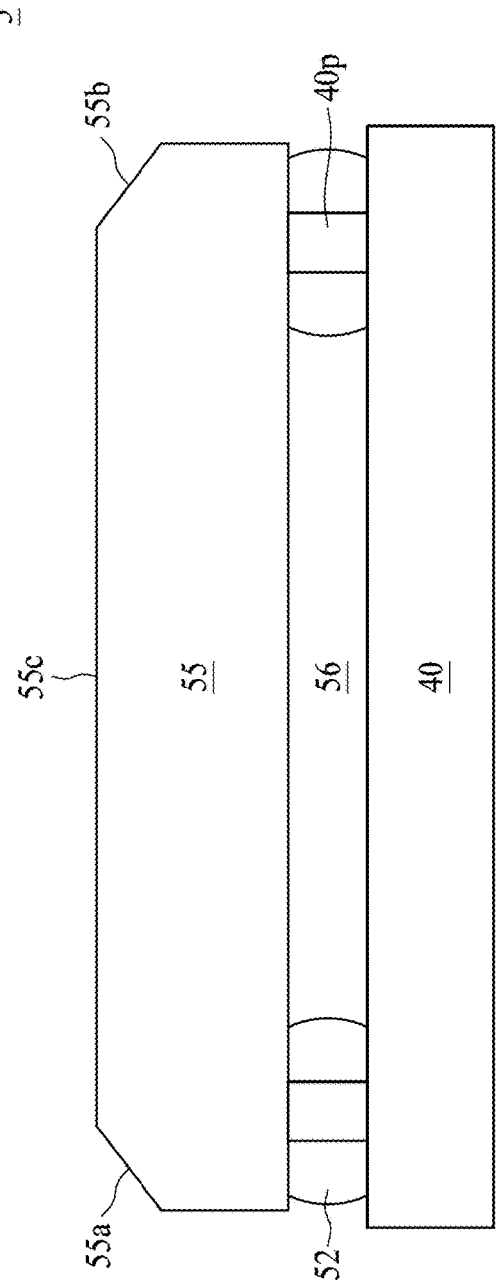
Figure 5D:
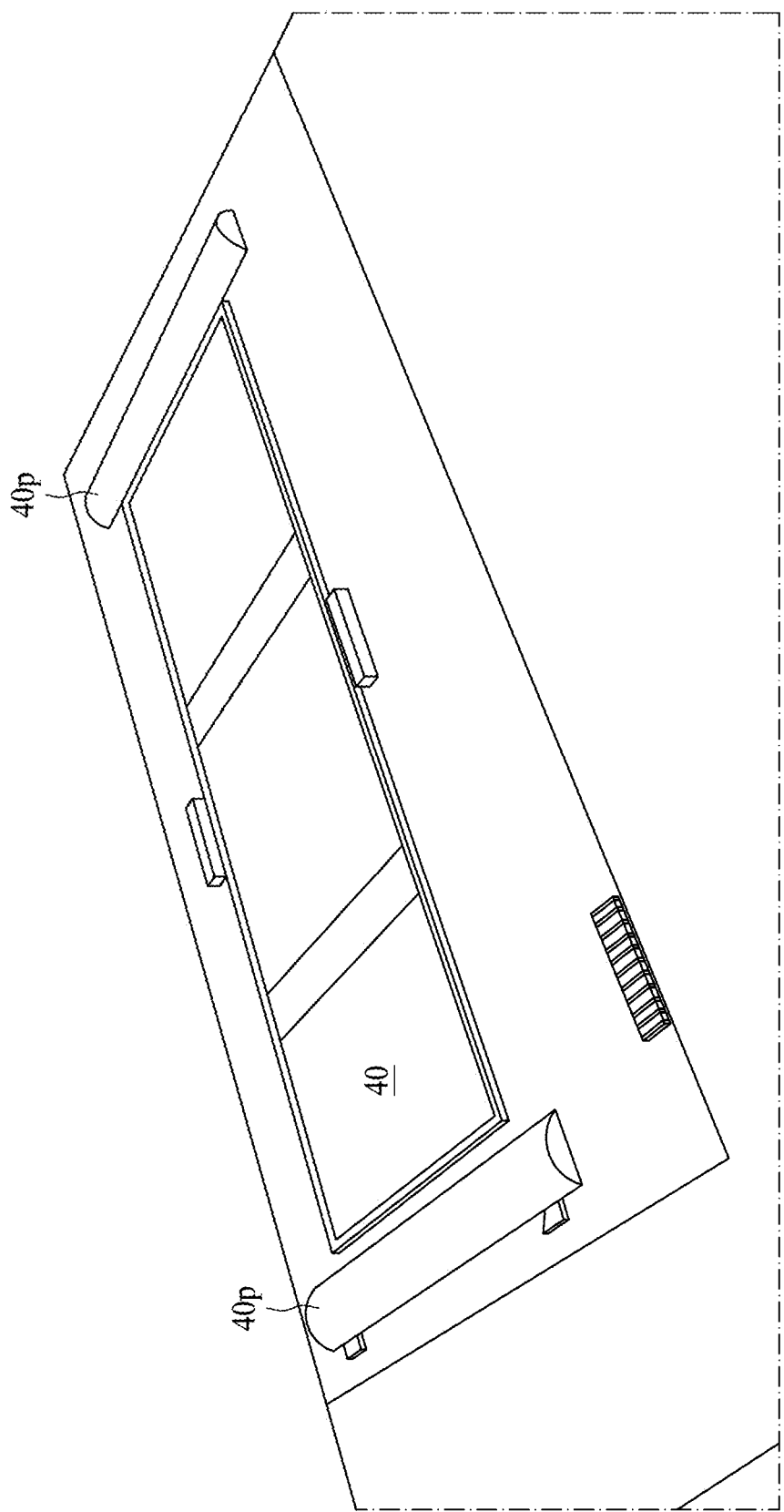

Referring to FIG. 5C, a liquid crystal is injected or applied into a space 40h defined by the glass layer 55 and the adhesive 52. Then a protection layer 56 (e.g., a molding compound or an underfill) is formed to cover the liquid crystal form the semiconductor device package 5. In some embodiments, the semiconductor device package 5 may be or include light detection and ranging (LiDAR) that requires a stable and precise BLT control.

Figure 6:
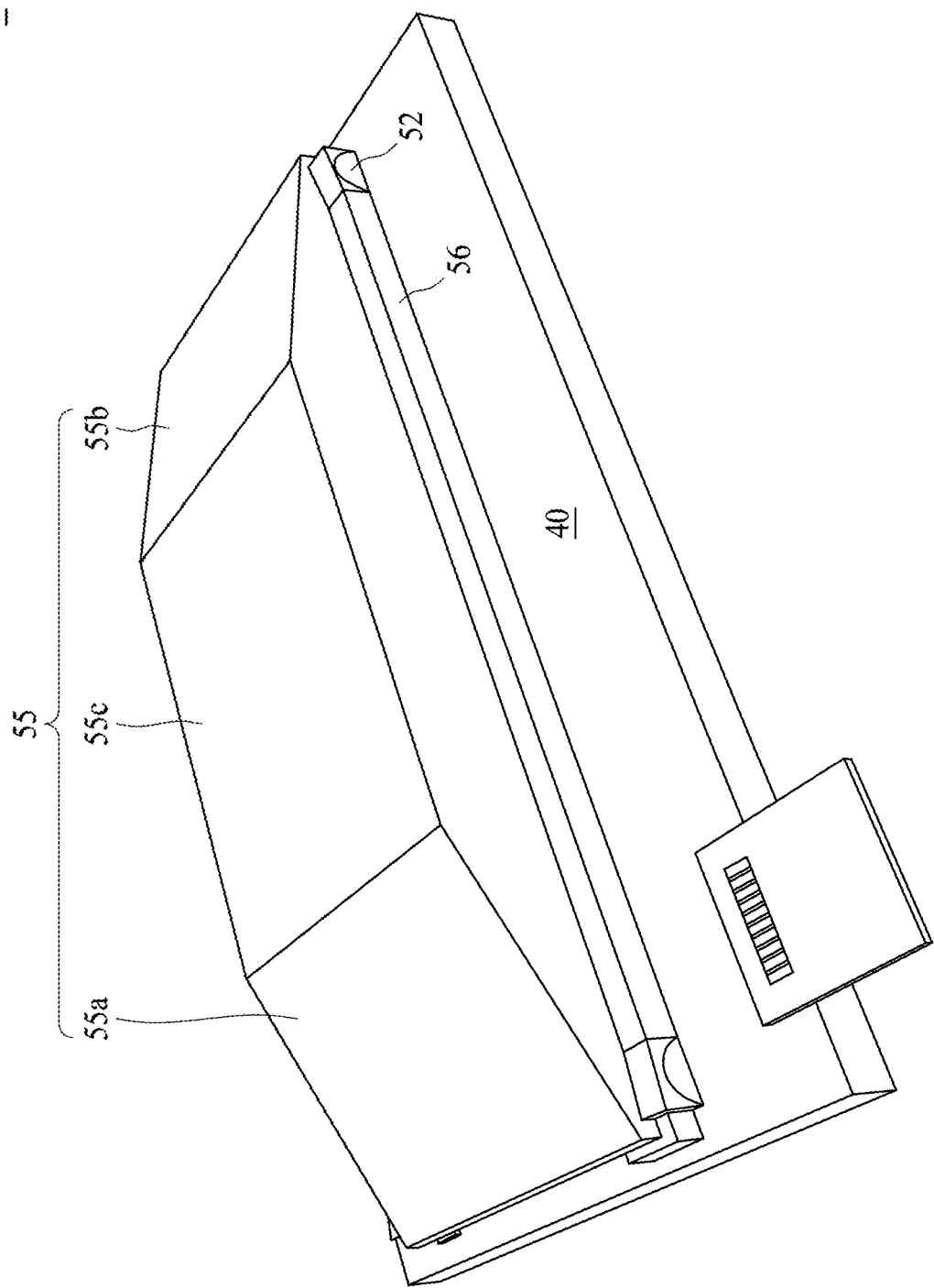
FIG. 6 illustrates a perspective view of the semiconductor device package in FIG. 5C in accordance with some embodiments of the present disclosure.

FIG. 6 illustrates a perspective view of the semiconductor device package 5 shown in FIG. 5 in accordance with some embodiments of the present disclosure.

The glass layer 55 is disposed on the substrate 10 and bonded to the substrate 10 through the adhesive 52. The glass layer 55 is supported by the pillars (which is covered by the adhesive 52 and not shown in FIG. 6). The liquid crystal (which is covered by the protection layer 56 and not shown in FIG. 6) is disposed in the space defined by the glass layer 55 and the adhesive 52. The glass layer 55 includes the first surface 55a configured to receive light and the second surface 55b configured to output the light. The glass layer 55 further includes the third surface 55c between the first surface 55a and the second surface 55b. The third surface 55c of the glass layer 55 is coated by an opaque material to prevent the light from emitting out of the third surface 55c.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

In some embodiments, two surfaces can be deemed to be coplanar or substantially coplanar if a displacement between the surfaces is small, such as no greater than 1 μm, no greater than 5 μm, or no greater than 10 μm.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method of manufacturing a semiconductor device package, the method comprising:
   providing a substrate with an opening penetrating therethrough;
   placing a photosensitive layer on the substrate to cover the opening;
   removing a portion of the photosensitive layer to form a support structure;
   applying an adhesive to cover the support structure; and
   connecting a micro-electro-mechanical system (MEMS) device on the support structure through the adhesive.

2. The method of claim 1, further comprising:
   disposing an optical mask on the photosensitive layer; and
   patterning the optical mask to define a gap exposing the portion of the photosensitive layer.

3. The method of claim 2, further comprising:
   curing the exposed portion of the photosensitive layer.

4. The method of claim 1, further comprising:
   forming a dam-like structure surrounding the opening of the substrate.

5. The method of claim 4, further comprising:
   disposing an optical mask on the photosensitive layer; and
   patterning the optical mask to define a first gap corresponding to the support structure and a second gap corresponding to the dam-like structure.

6. The method of claim 5, wherein the second gap surrounds the opening of the substrate.

7. The method of claim 4, wherein the dam-like structure is not covered by the adhesive when applying the adhesive.

8. The method of claim 1, further comprising:
   curing the adhesive to connect the MEMS device to the support structure.

9. The method of claim 1,
   wherein the MEMS device includes a cavity corresponding to the opening of the substrate.

10. The method of claim 9, wherein the opening of the substrate is substantially aligned with the cavity of the MEMS device.

11. A method of manufacturing a semiconductor device package, the method comprising:
    providing a substrate with an opening penetrating therethrough;
    placing a solder mask on the substrate;
    removing a portion of the solder mask to form a support structure and a dam-like structure;
    disposing an adhesive on the substrate to cover the support structure, wherein the dam-like structure is exposed from the adhesive; and
    disposing a microelectromechanical systems (MEMS) device on the support structure and the dam-like structure.

12. The method of claim 11, further comprising:
    disposing an optical mask on the solder mask; and
    patterning the optical mask to define a gap exposing the portion of the solder mask.

13. The method of claim 12, further comprising:
    curing the exposed portion of the solder mask.

14. A semiconductor package, comprising:
    a substrate defining an opening;
    a support structure disposed on the substrate, wherein the support structure has a top surface, a bottom surface, and a lateral surface extending between the top surface and the bottom surface;
    a dam-like structure disposed on the substrate, wherein the dam-like structure surrounds the opening of the substrate;
    a MEMS device disposed on the support structure; and
    an adhesive disposed between the substrate and the MEMS device and covering the support structure;
    wherein a first part of the lateral surface is facing toward the opening and exposed from the adhesive.

15. The semiconductor package of claim 14, wherein the adhesive is in contact with a second part of the lateral surface of the support structure.

16. The semiconductor package of claim 14, wherein the support structure includes a solder mask.

17. The semiconductor package of claim 14, wherein a hardness of the support structure is less than a hardness of the MEMS device.

18. The semiconductor package of claim 14, wherein the top surface is in contact with the MEMS device.

\* \* \* \* \*